(12) United States Patent
Martoff et al.

(10) Patent No.: US 11,994,427 B2
(45) Date of Patent: May 28, 2024

(54) SILICON PHOTOMULTIPLIER IMAGING SYSTEM AND METHOD FOR COOLING THE SAME

(71) Applicant: Temple University-Of The Commonwealth System of Higher Education, Philadelphia, PA (US)

(72) Inventors: C. J. Martoff, Philadelphia, PA (US); Donald Jones, Philadelphia, PA (US); Andrew Ponento, Yardley, PA (US)

(73) Assignee: Temple University-Of The Commonwealth System of Higher Education, Philadelphia, PA (US)

( * ) Notice: Subject to any disclaimer, the term of this patent is extended or adjusted under 35 U.S.C. 154(b) by 509 days.

(21) Appl. No.: 17/280,741

(22) PCT Filed: Sep. 27, 2019

(86) PCT No.: PCT/US2019/053338
§ 371 (c)(1),
(2) Date: Mar. 26, 2021

(87) PCT Pub. No.: WO2020/112230
PCT Pub. Date: Jun. 4, 2020

(65) Prior Publication Data
US 2022/0113185 A1    Apr. 14, 2022

Related U.S. Application Data

(60) Provisional application No. 62/737,537, filed on Sep. 27, 2018.

(51) Int. Cl.
*G01J 1/44*       (2006.01)
*H01J 37/244*  (2006.01)
*H10N 10/13*   (2023.01)

(52) U.S. Cl.
CPC ............... *G01J 1/44* (2013.01); *H01J 37/244* (2013.01); *H10N 10/13* (2023.02); *G01J 2001/4453* (2013.01); *H01J 2237/2445* (2013.01)

(58) Field of Classification Search
CPC ........... G01J 1/44; H10N 10/13; H01J 37/244
See application file for complete search history.

(56) References Cited

U.S. PATENT DOCUMENTS

| | | | |
|---|---|---|---|
| 3,757,151 A * | 9/1973 | Ace | H10N 10/00 62/3.2 |
| 3,814,964 A * | 6/1974 | Ace | H01J 43/04 313/544 |
| 3,998,592 A | 12/1976 | Pyle | |
| 4,525,080 A | 6/1985 | Smith | |
| 5,304,492 A | 4/1994 | Klinkhammer | |
| 6,080,988 A | 6/2000 | Ishizuya | |

(Continued)

*Primary Examiner* — Hugh Maupin
(74) *Attorney, Agent, or Firm* — Riverside Law LLP

(57) ABSTRACT

A light detection and measurement device comprises a silicon photomultiplier, at least one thermoelectric cooler thermally coupled to the silicon photomultiplier, a sealed enclosure surrounding the silicon photomultiplier and the at least one thermoelectric cooler, the enclosure including a substantially transparent window thermally coupled to the silicon photomultiplier, and a heat sinking device thermally coupled to the enclosure configured to remove waste heat. A method of cooling a silicon photomultiplier is also described.

17 Claims, 12 Drawing Sheets

(56) References Cited

U.S. PATENT DOCUMENTS

| | | |
|---|---|---|
| 2002/0039186 A1 | 4/2002 | Rosenberg |
| 2004/0027462 A1 | 2/2004 | Hing |
| 2004/0135071 A1* | 7/2004 | Negi .................. H01J 7/24 |
| | | 250/214 R |
| 2004/0245592 A1* | 12/2004 | Harmon ............ G01J 1/4228 |
| | | 257/E27.128 |
| 2008/0099684 A1* | 5/2008 | Murakami ............ G01T 1/20 |
| | | 250/361 C |
| 2008/0251125 A1 | 10/2008 | Cheng |
| 2013/0032713 A1 | 2/2013 | Barbi |
| 2013/0193332 A1* | 8/2013 | Menge ............... H01L 31/115 |
| | | 250/487.1 |
| 2013/0240742 A1* | 9/2013 | Menge ............... G01T 1/2002 |
| | | 250/361 R |
| 2016/0104806 A1 | 4/2016 | Thrush |
| 2016/0181293 A1* | 6/2016 | McGarvey ............ H01L 24/73 |
| | | 257/438 |
| 2016/0284525 A1* | 9/2016 | Katzlinger ......... G01N 21/645 |
| 2017/0023281 A1 | 1/2017 | Fromm |
| 2017/0059720 A1* | 3/2017 | McBroom ......... G01T 1/20188 |
| 2019/0252558 A1* | 8/2019 | Frese .................. G01N 21/763 |

\* cited by examiner

SILICON PHOTOMULTIPLIER IMAGING SYSTEM AND METHOD FOR COOLING THE SAME

CROSS-REFERENCE TO RELATED APPLICATIONS

This application is a 35 U.S.C. § 371 national phase application from, and claiming priority to, International Application No. PCT/US2019/053338, filed Sep. 27, 2019, which claims priority to U.S. provisional patent application No. 62/737,537 filed on Sep. 27, 2018, both of which are incorporated herein by reference in their entirety.

BACKGROUND OF THE INVENTION

Photomultiplier tubes (PMT) are still the workhorses of low level (including single-photon) light detection. These vacuum tube devices work by electron-impact multiplication of photo-electrons. They are widely used in spectroscopy, particle physics, astrophysics, medical diagnosis, and military technology. Recently a solid state replacement for the PMT, called the Silicon Photomultiplier (SiPM) has arrived on the market. SiPM have numerous advantages such as much smaller size, lower cost, ruggedness, insensitivity to stray magnetic fields, and requires much less power and in particular no kilovolt bias to operate. With reference to FIG. 1, a size comparison of a conventional PMT next to an SiPM is shown. A quarter is shown for scale in the right of the image.

While SiPM are beginning to be used in science and industry, their usefulness is limited by high dark current, sometimes referred to as dark noise. Dark current, as understood in the art, is the signal produced by a photosensor in the absence of any incident light. At room temperature, SiPMs produce enough dark current such that the resulting noise in the measured image masks the small signals from low-level light inputs. Certain SiPMs have dark current from thermally excited electrons equivalent to tens or hundreds of thousands of electrons per second per millimeter squared. This high noise level prevents spectroscopy down to the level of few-photon pulses, usually completely prevents large-area single photoelectron detection, and significantly degrades the spectroscopic energy resolution for larger pulses containing hundreds or thousands of photoelectrons, like those typically examined using nuclear physics scintillators used to identify radioactive substances. In applications where it is desirable to be able to measure single photons, the disadvantage is clear. Various methods for dark noise reduction exist, for example cooling with liquid cryogens, but this limits wide application of the device and makes it unsuitable as a bolt-on replacement for the vacuum photomultipliers still predominantly used in scintillation spectroscopy applications.

Thus, there is a need in the art for system and method for reducing dark noise in SiPM, such that the resulting SiPM can act as a self-contained replacement for a vacuum PMT with improved performance, dark current at similar levels to a conventional PMT, smaller size, no requirement for kilovolt bias, and increased ruggedness. The present invention satisfies this need.

SUMMARY OF THE INVENTION

In one aspect, a light detection and measurement device comprises a silicon photomultiplier, at least one thermoelectric cooler thermally coupled to the silicon photomultiplier, a sealed enclosure surrounding the silicon photomultiplier and the at least one thermoelectric cooler, the enclosure including a substantially transparent window thermally coupled to the silicon photomultiplier, and a heat sinking device thermally coupled to the enclosure configured to remove waste heat. In one embodiment, the at least one thermoelectric cooler comprises two thermoelectric coolers arranged in series. In one embodiment, the at least one thermoelectric cooler comprises two thermoelectric coolers arranged in parallel. In one embodiment, the sealed enclosure comprises copper. In one embodiment, the sealed enclosure comprises stainless steel.

In one embodiment, the window comprises sapphire. In one embodiment, the window is in direct contact with the silicon photomultiplier. In one embodiment, the window is thermally coupled to the silicon photomultiplier with a thermally conductive paste. In one embodiment, the heat sinking device is comprises a forced-air cooled heat sink. In one embodiment, the heat sinking device comprises a water-cooled heat sink. In one embodiment, the sealed enclosure is positioned in an outer enclosure. In one embodiment, the outer enclosure is fluidly connected to a vacuum pump configured to maintain a pressure in the outer enclosure of less than one milliTorr. In one embodiment, the outer enclosure is filled with a dry gas.

In another aspect, a method for cooling a silicon photomultiplier comprises providing a silicon photomultiplier and at least one thermoelectric cooler, cooling the silicon photomultiplier by energizing the thermoelectric cooler, and removing waste heat from the thermoelectric cooler with a heat sinking device. In one embodiment, the at least one thermoelectric cooler comprises two thermoelectric coolers in series. In one embodiment, the at least one thermoelectric cooler comprises two thermoelectric coolers in parallel. In one embodiment, the method further comprises enclosing the silicon photomultiplier and the at least one thermoelectric cooler in a vacuum chamber. In one embodiment, the method further comprises enclosing the silicon photomultiplier and the at least one thermoelectric cooler in a sealed chamber filled with a dry gas. In one embodiment, the heat sinking device is a forced-air cooled heat sink. In one embodiment, the method comprises cooling the silicon photomultiplier to a temperature less than −15° C.

BRIEF DESCRIPTION OF THE DRAWINGS

The foregoing purposes and features, as well as other purposes and features, will become apparent with reference to the description and accompanying figures below, which are included to provide an understanding of the invention and constitute a part of the specification, in which like numerals represent like elements, and in which.

DETAILED DESCRIPTION

It is to be understood that the figures and descriptions of the present invention have been simplified to illustrate elements that are relevant for a clear understanding of the present invention, while eliminating, for the purpose of clarity, many other elements found in related systems and methods. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Aspects of the present invention are presented as light detection and measurement devices, however it is understood that the devices and methods disclosed herein could be used in other applications, including but not limited to imaging.

Figure 1:
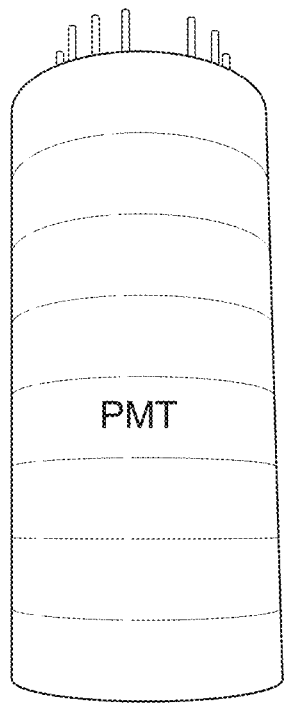
FIG. 1 is an illustration of the size comparison between a conventional and silicon based photomultiplier.
Figure 1:
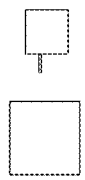
Figure 1:
Figure 2A:
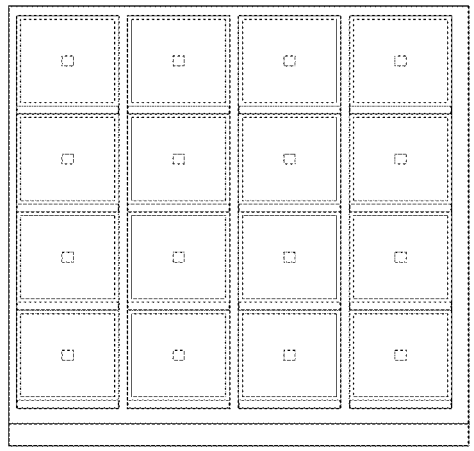
FIG. 2A is an exemplary silicon photomultiplier.
Figure 2B:
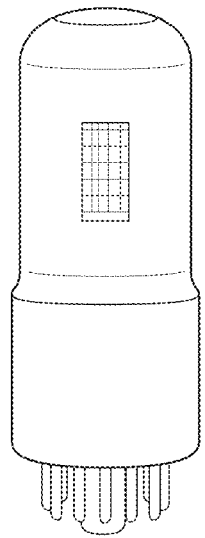
FIG. 2B is an exemplary vacuum photomultiplier tube.

Aspects of the present invention relate to cooled SiPMs as a replacement for a PMT. With reference to FIG. 2A and FIG. 2B, a close-up view of an exemplary SiPM is shown in FIG. 2A, while a line drawings of a conventional PMT is shown in FIG. 2B. The SiPM of FIG. 2A is a Hamamatsu S13361-2050AE-04, while the PMT of FIG. 2B is a Hamamatsu R636-10. Although these photomultipliers are shown in the drawings, it is understood that the system of the present invention is suitable for use with other SiPMs as well.

In one embodiment, a dark noise reduction device of the present invention uses one or more stages of thermoelectric cooling, for example using a Peltier effect cooler, to cool an SiPM array to −20 C. In some embodiments, a device of the present invention may be used to cool the SiPM to less than −15 C, less than −30 C, less than −40 C, or cooler. In one example, two stages are used, but more stages of cooling are contemplated. In exemplary embodiments, a two-stage cooled array saw dark noise reduced by more than 100× compared to the same SiPM at room temperature operation. In some embodiments, cooling is performed in an evacuated or controlled atmosphere enclosure to avoid condensation. The performance of an array cooled with the system of the present invention (as measured in energy resolution) exceeds that of a conventional PMT for nuclear spectroscopy with sodium iodide (NaI), particularly for low energy gamma rays. Although thermoelectric cooling is discussed, it is understood that other cooling methods may be used, for example with a circulated liquid or phase change material. In some embodiments, cooling is accomplished via liquid nitrogen or liquid helium circulated to the SiPM array.

Figure 3A:
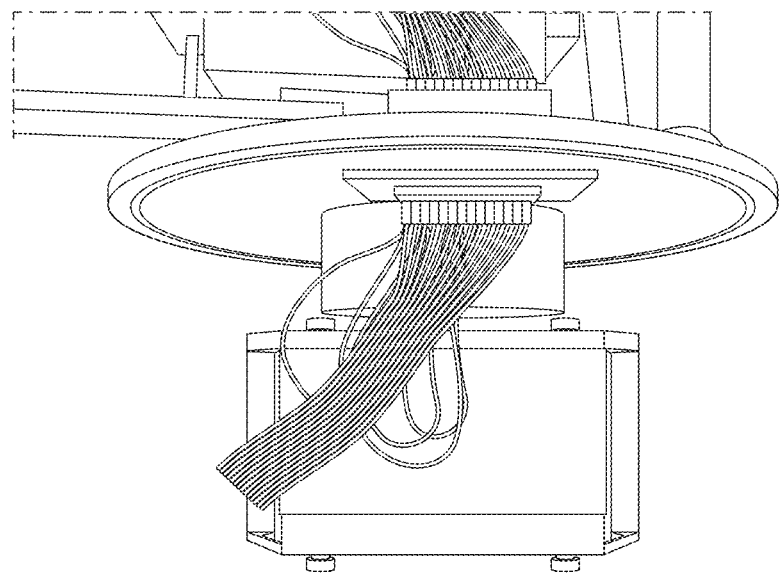
FIG. 3A is a side view of an exemplary cooled silicon photomultiplier.
Figure 3B:
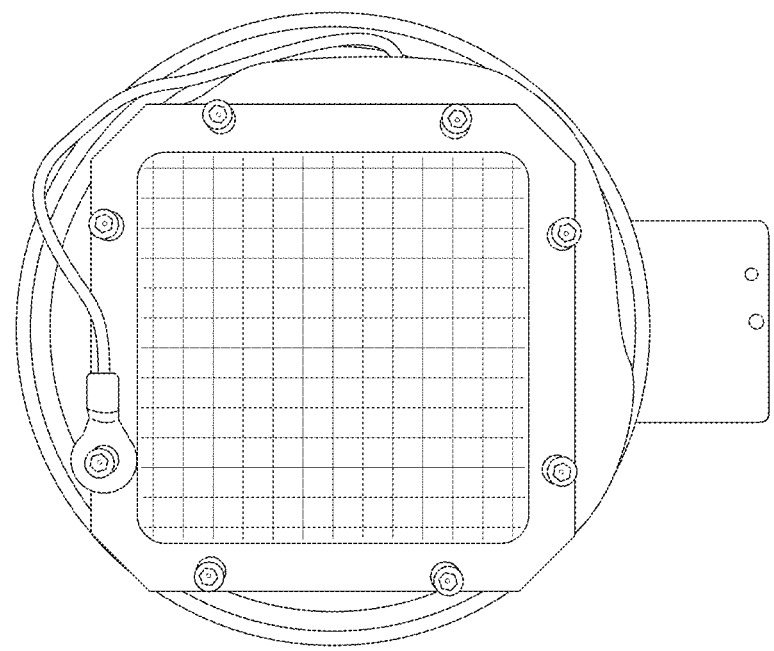
FIG. 3B is a top view of an exemplary cooled silicon photomultiplier.

With reference now to FIG. 3A and FIG. 3B, an exemplary cooled SiPM is shown. To prevent condensation on the cooled SiPM, an evacuated or controlled-atmosphere cooling enclosure is needed. For the depicted prototype, a conventional stainless steel pipe with o-ring closures was used, with a borosilicate window (visible in FIG. 3B) to admit the light signals, and a rotary vacuum pump. Although the depicted window comprises borosilicate, it is understood that a suitable window may be made from any material transparent or translucent to the wavelengths of light of interest in the device, for example a plastic, glass, or any other suitable material. In some embodiments, the window is thermally conductive.

Thermal contact for cooling may be achieved with a sapphire window in direct contact with the sensitive area of the SiPMs. This is coupled to the outside through a machined copper holder leading to a copper cylinder making a vacuum seal, as shown in FIG. 3A and FIG. 3B. In some embodiments, a window may be configured not in direct contact with the sensitive area of the SiPMs, for example there may be a gap containing air, another gas, vacuum, or a fluid or paste, for example a transparent and thermally conductive fluid or paste, positioned between the sensitive area of the SiPMs and the window.

Cooling may be provided by two thermoelectric coolers (TEC) in series. These use an electric current to produce a temperature difference between two unlike semiconductor materials, which can transfer many watts of heat. One TEC is inside the vacuum chamber between the copper casing and the copper cylinder, and the second is outside the vacuum between the copper cylinder and a waste heat removal device. In some embodiments, water cooling is used for waste heat removal, while in other embodiments a large forced-air cooled heat sink may be used, thus making the device more portable.

Figure 4:
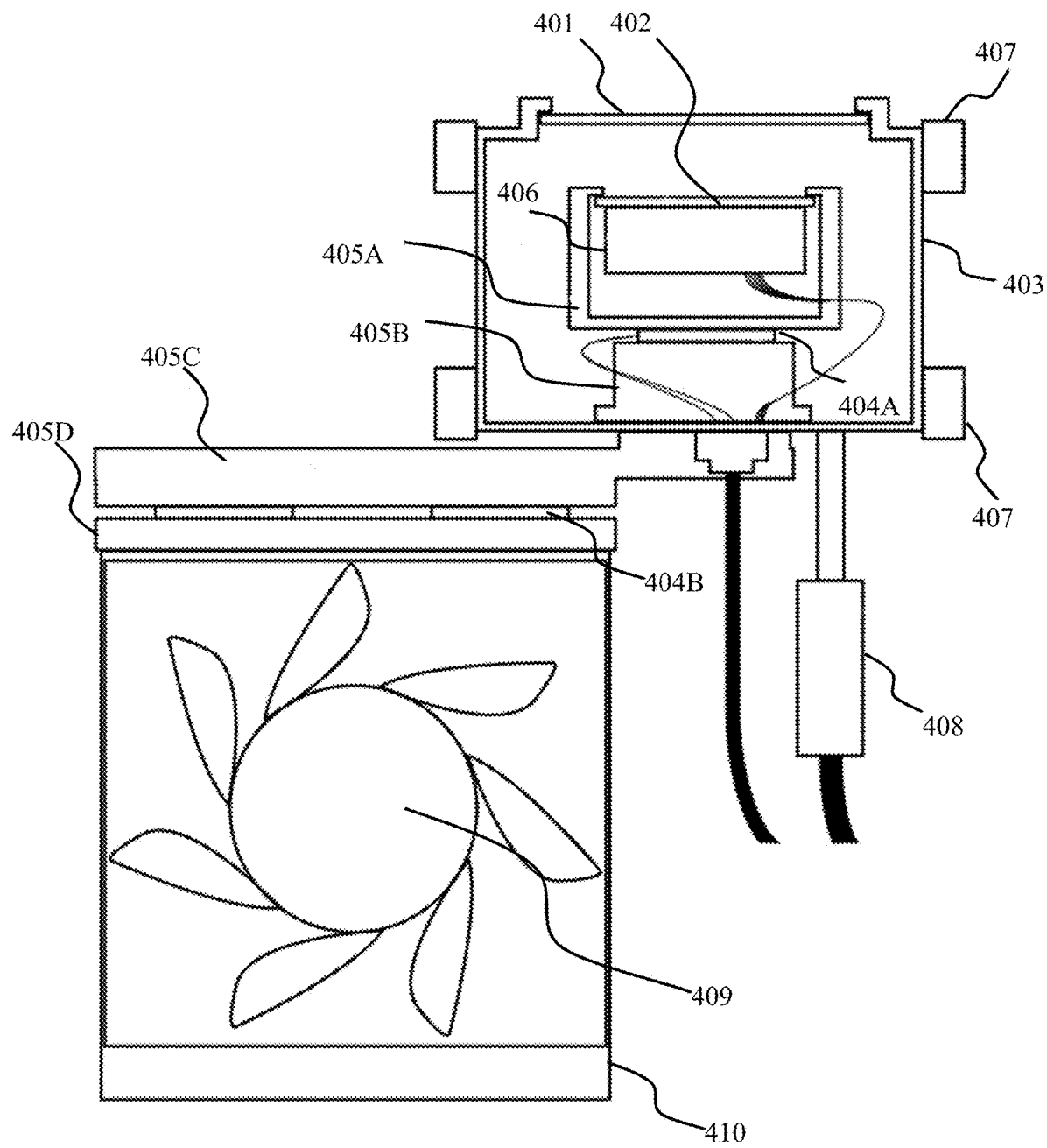
FIG. 4 is a diagram of a silicon photomultiplier apparatus of the present invention.

An exemplary diagram of an apparatus of the invention is shown in FIG. 4. If cooled below the dew point (around 10° C. for typical indoor environments), cooled parts must be isolated from the surrounding atmosphere to avoid condensation. This can be done with an enclosure 403 containing dry gas or vacuum. The thermal conductivity of gases is nearly independent of pressure down to below one milliTorr, so the choice of isolation hardly affects the thermal performance unless rather low pressures can be achieved. In one embodiment, a rough vacuum of about 500 milliTorr was used. In other embodiments, enclosure 403 may be a sealed, gas-filled chamber, which would obviate the need for a vacuum pump. In some embodiments, the chamber is filled with an inert gas.

Inside the rough vacuum, the SiPM 406 may be placed inside an open copper frame 405A, which in direct contact with the cold side of a thermoelectric cooler 404A. The open side of the copper frame 405A holds a sapphire window 402 mounted with thermal coupling compound, and the SiPM 406 is mounted against the window with springs and optical grease, providing the thermal contact with the TEC. Sapphire was used in the exemplary apparatus because of its excellent optical viewing characteristics, strength and stability, and high thermal conductivity, but it is understood that in other embodiments alternative materials may be used.

The enclosure 403 may be for example a stainless steel cylinder chamber, or may be made of any other suitable durable material, and may have any suitable shape. A rotary vacuum pump 408 is connected to the base in order to maintain a rough vacuum, and the interior electronics received power via feedthroughs. A borosilicate glass window 401 in front of the sapphire 402 enables the SiPM assembly to be air-coupled to a typical encapsulated NaI scintillator (not shown).

Cooling may be accomplished using thermoelectric coolers (TECs), for example Marlow model XLT2422, which are solid-state devices that transport heat against a temperature gradient via the Peltier Effect.

The depicted embodiment uses a single "primary" TEC 404A inside the enclosure, in indirect contact with the SiPM 406. The TEC specification gives a maximum temperature difference between hot and cold sides of 66° C. Thus, to achieve a SiPM temperature of −20° C. requires that the hot side of the primary TEC 404A be at most 25° C. This temperature is directly determined by the efficiency with which heat (both the radiation and conduction heat load of the system and the Joule heating from the TEC power input) is removed from the hot side of the inner TEC 404A. To achieve the present level of performance, four additional TECs 404B mounted in parallel, outside the enclosure were found to be required to maintain the inner TEC 404A hot side temperature below 30° C. Finally, the heat of the four outside TECs is removed by forced air cooling with a large heat sink 410 in the room air, cooled by a fan 409. The TECs are thermally connected to one another and to the heat sink via thermal links 405B, 405C, and 405D. Thermal links may comprise any thermally conductive material, including for example silver or copper.

TABLE 1

| Heat Load (W) | Section I | Section II | Section III |
|---|---|---|---|
| Conductive | 1.6 | — | — |
| Convective | 1.1 | 0.8 | — |
| Radiative | 2.9 | 0.8 | — |
| Electric | 0.22 | 33 | 170 |
| Total | 5.8 | 35 | 170 |

Table 1 above shows the heat loads of the system, where the "sections" are defined by their relative temperatures. Section I is the coldest stage and includes the SiPM 406, Section II is between the single TEC 404A and the four parallel TECs 404B, and Section III is the final heat load transferred to the heat sink 410. The heat load of the system for Sections II and III is mainly dominated by the Joule heating of the electric power supplied to the solid-state coolers. While radiation, conduction, convection, and to a lesser extent electric power of the SiPM heat up the device in Section I, their overall contribution across all sections is miniscule compared to that of the current powering the solid-state coolers. These require about 3 A and 17V DC each, and there are five in the depicted device. In the depicted example, this creates a total waste heat load of approximately 215 W.

To remove the waste heat, a Wakefield-Vette I392-120AB7 heat sink is attached to the hot side of four external TECs through a copper plate. This sink may comprise aluminum, with a specified thermal resistance of only 0.11° C./Watt, and in the depicted example measures approximately 120 by 120 by 130 mm. To achieve the specified thermal resistance and the desired copper plate temperature of 50° C., forced air heating was used with a push-pull set of two Orion AC powered muffin fans, model OA109AP-11-TBXC8. This heat sink system may be configured to maintain the desired external copper plate at a temperature of 50° C., which resulted in a measured SiPM temperature of −20° C.

In some embodiments, a water-cooled or otherwise fluid cooled heat sink may be used, for example a water-cooled heat sink flowing water at 1.5 gpm.

In some embodiments, the conduction and convection heat load could be eliminated or reduced by using a sealed high vacuum enclosure with integral getter pump, reducing Section I heat load by 50%. Additional superinsulation could also be employed to further reduce the radiation heat load on the copper holder. In some embodiments, a multi-stage TEC is used for the primary cooler.

Figure 5A:
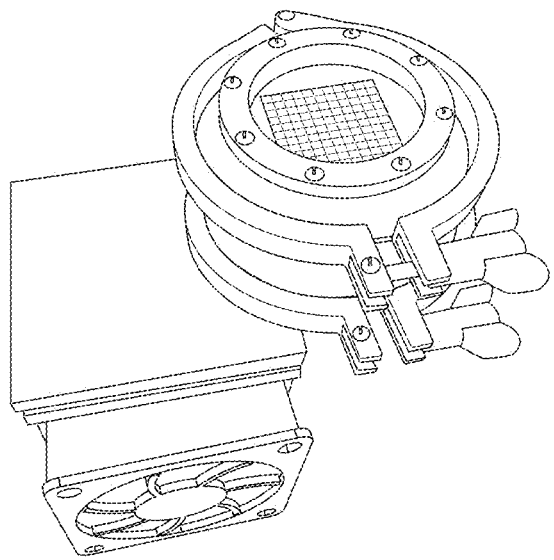
FIG. 5A and FIG. 5B are line drawings of an exemplary photomultiplier apparatus of the present invention.
Figure 5B:
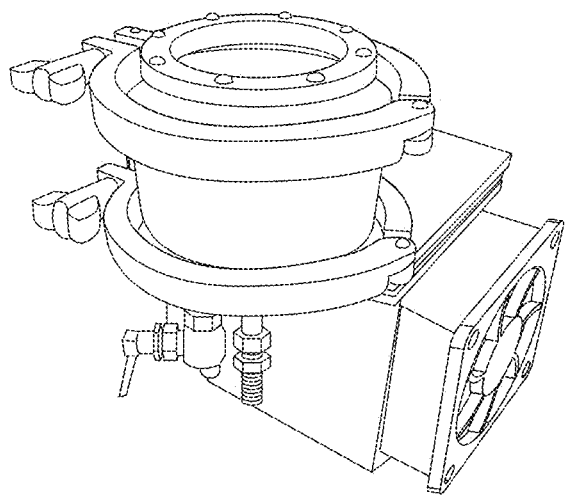

Line Drawings of an exemplary apparatus of the present invention are shown in FIG. 5A and FIG. 5B. In FIG. 5A, an exemplary device is shown with the borosilicate viewing window at top right and the SiPM array visible below it. Limited space on the lower vacuum flange required the copper heat path to be offset as shown. One of the fans is visible as the black object at left front. In FIG. 5B, the heatsink and the second fan are shown underneath the copper plate.

EXPERIMENTAL EXAMPLES

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present invention. The following working examples therefore, specifically point out the exemplary embodiments of the present invention and are not to be construed as limiting in any way the remainder of the disclosure.

First Experimental Example

Methods

Figure 6:
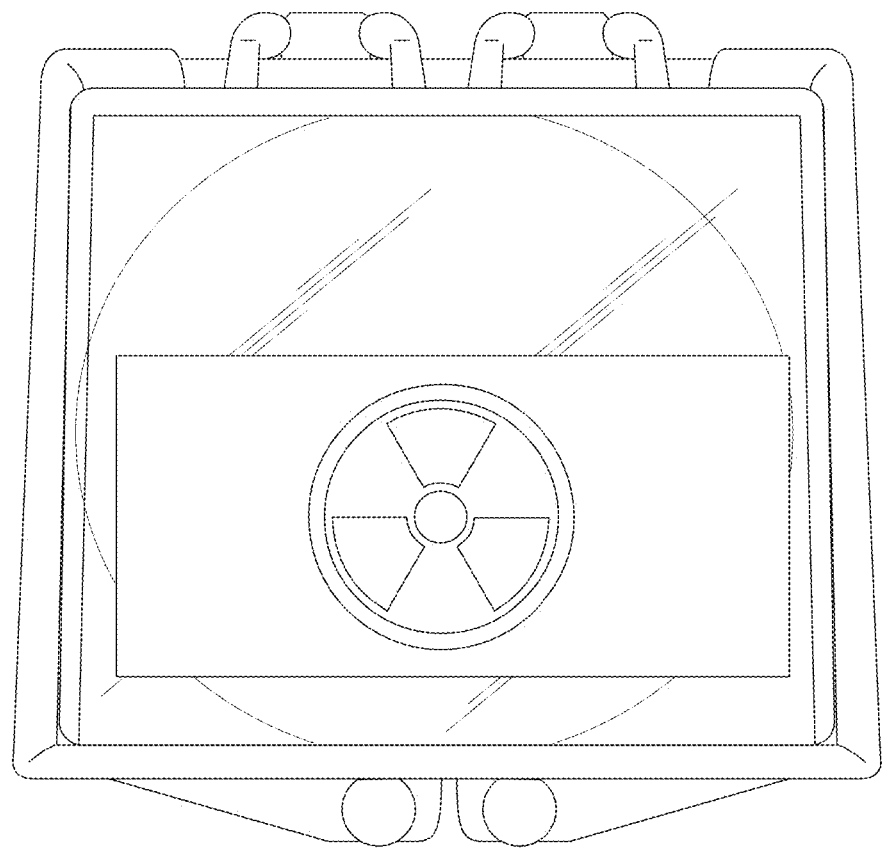
FIG. 6 is a radioactive material used in an experimental example of a system of the present invention.
Figure 7:
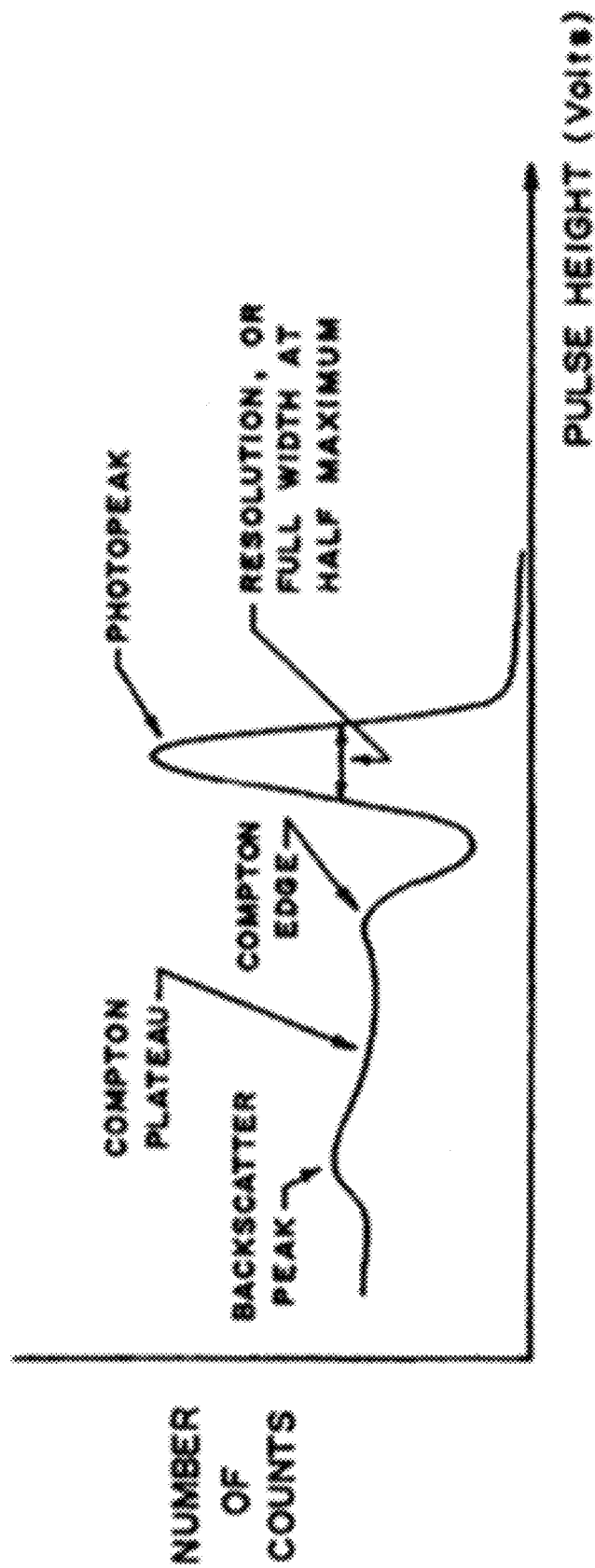
FIG. 7 is an exemplary spectral graph.

A cooled SiPM was assembled as shown in FIG. 3A and FIG. 3B. Within a properly sealed vacuum chamber, the SiPM array was cooled to −17 degrees Celsius. To start testing the SiPM's effectiveness at this temperature, the assembly was placed in a dark box where it viewed solid scintillators (NaI and YAP), stimulated to emit low level light pulses by various radioactive sources. The first source we used was Cs-137 (see FIG. 6), a source of monoenergetic 661 keV gamma rays. These produce light pulses of just a few hundred photons from the NaI. This source's spectrum as observed with a PMT, has the key features that are shown in FIG. 7.

Results

Figure 8A:
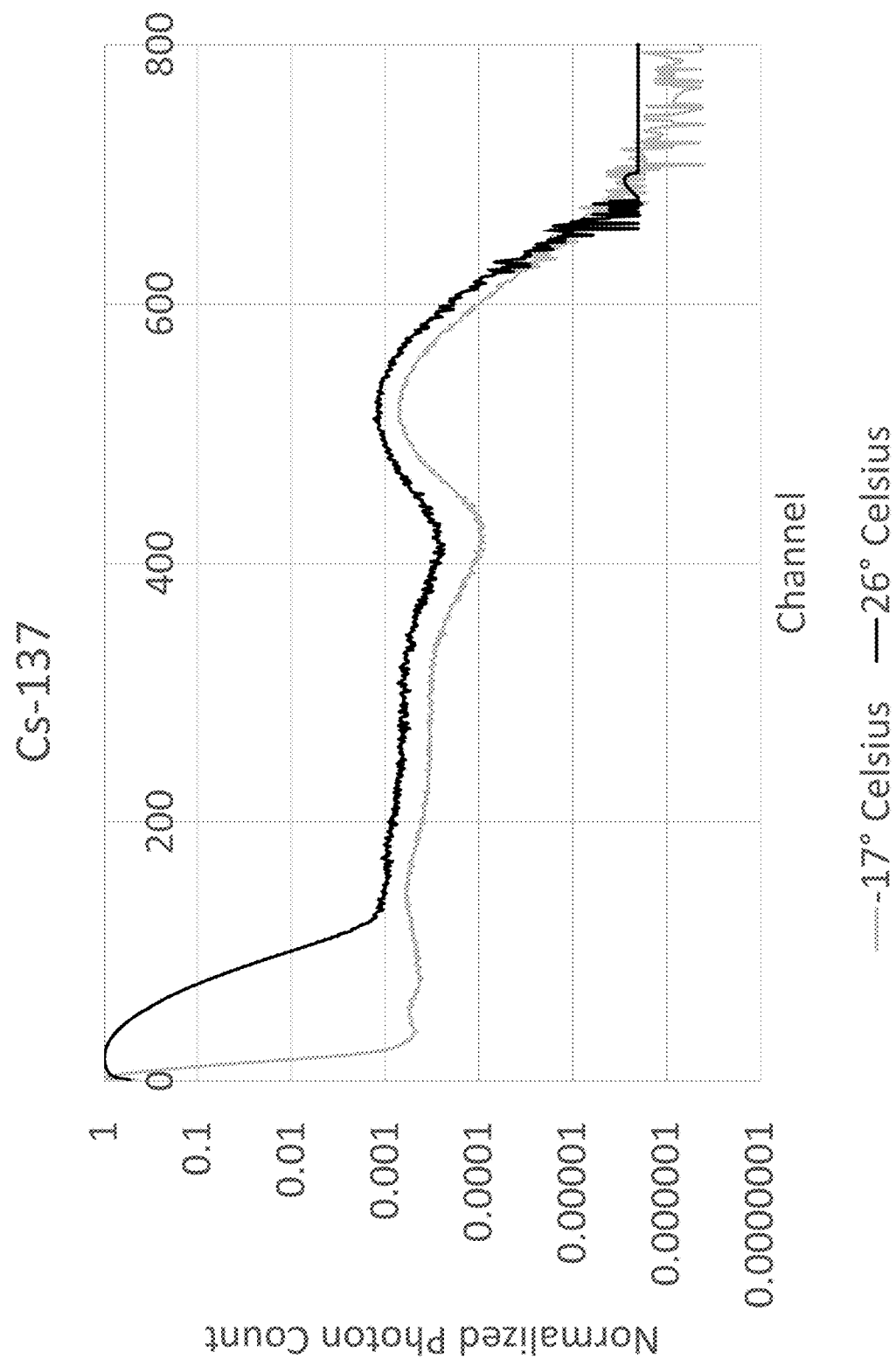
FIG. 8A is a graph showing experimental results.

The high dark count of the SiPM at room temperature was seen to partially obscure these features, as seen in FIG. 8A. The improvement when the SiPM is cooled to −17 degrees Celsius is apparent in FIG. 8A. Cooling the SiPM reduced the total photon count, which made some of the more subtle features of the spectral curve more evident.

As shown in FIG. 8A, the photopeak of cesium has a higher resolution at the colder temperature. Its full width at half maximum (FWHM), a quantitative indication of the resolution, is 20% at 26 degrees Celsius and 17% at −17 degrees Celsius. Another indicator of resolution is the valley to peak ratio, which was 18% at 26 degrees and 12% at −17 degrees. Both indicators represent significant improvements at cold temperatures due to the strongly reduced statistical fluctuations due to dark noise. Qualitatively, one can see the Compton Edge, Compton Plateau, and Backscatter Peak in the cold data while only the Compton Edge is barely visible in the hot data.

Figure 8B:
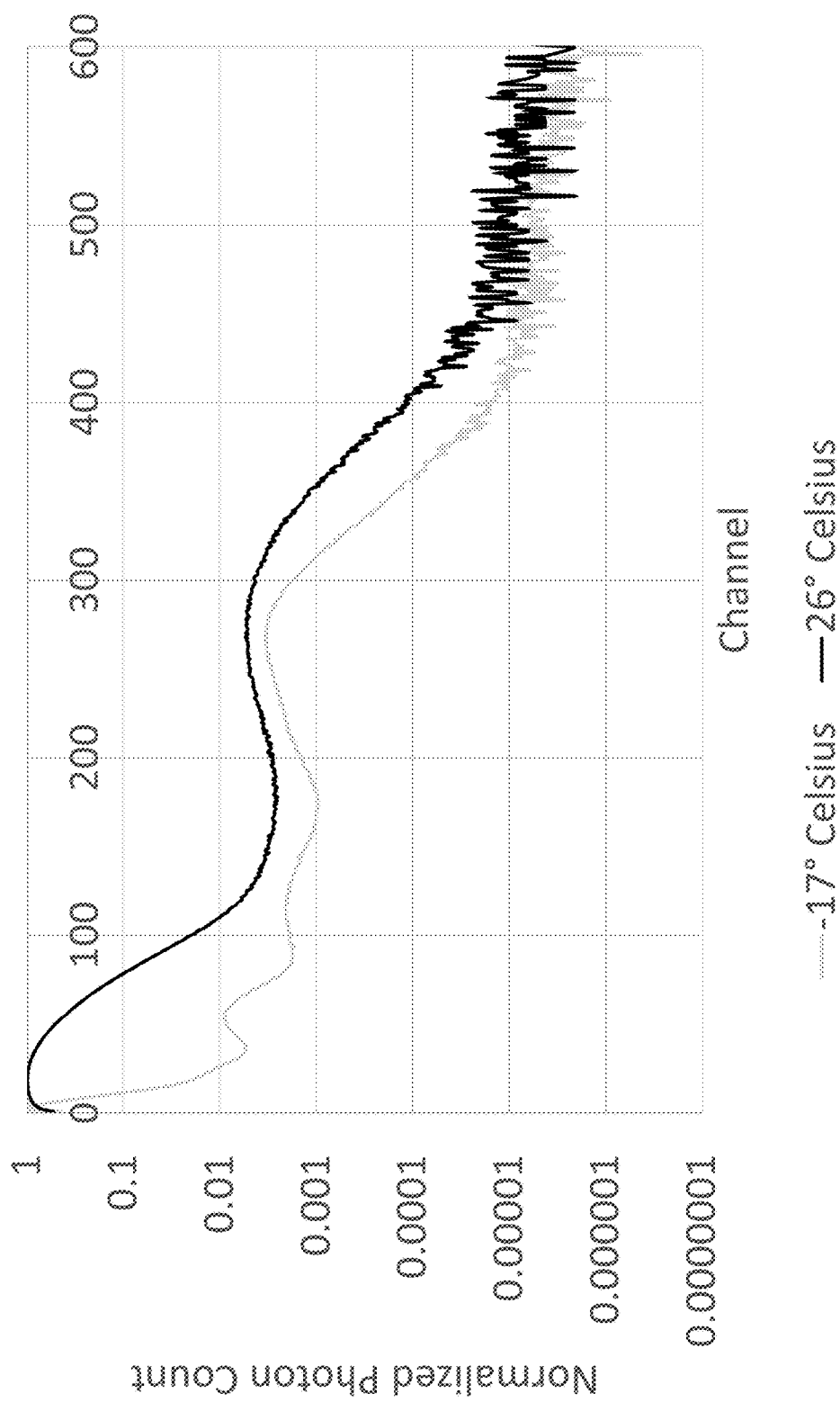
FIG. 8B is a graph showing experimental results.

FIG. 8B shows data from a Ba-133 source, which emits much lower energy gamma rays than Cs-137 and is therefore even more affected by dark noise. In the uncooled data, all one sees is a single peak. However, once we cool the SiPM, we see that this peak is partially resolved into two peaks, as expected from the nuclear data for this source. We also see two more (expected) peaks at lower channels that were not visible at all previously.

Figure 8C:
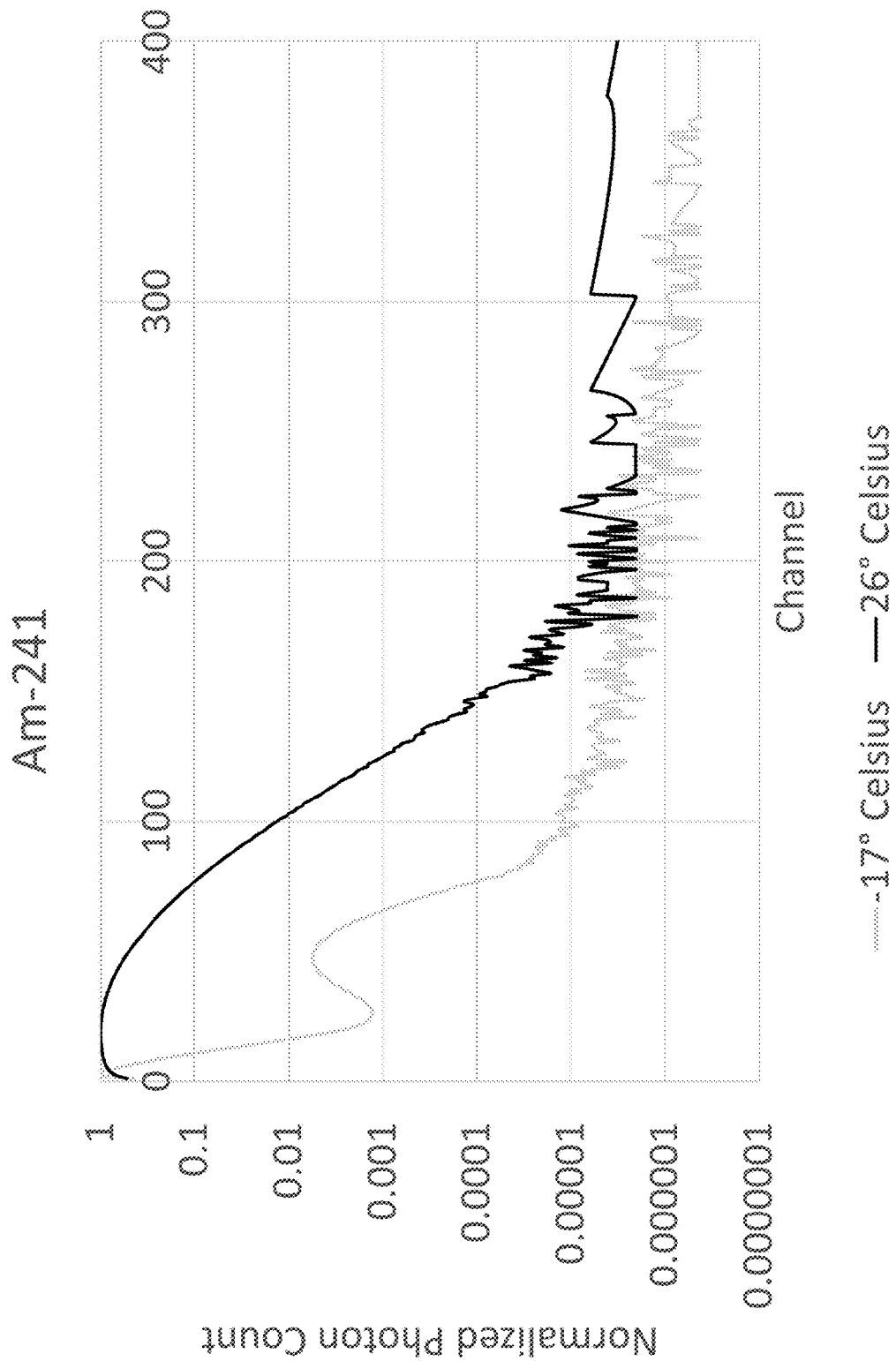
FIG. 8C is a graph showing experimental results.

For the most stringent test, Am-241 was used as the radioactive source (see FIG. 8C). The only gamma ray from this source is a very low 60 keV. At room temperature this gamma is not visible against the low channel noise. When cooling the SiPM, the 60 kV photopeak becomes clearly visible. This corresponds to only a few tens of scintillation photons being detected by the SiPM.

The device tested was a small, nearly self-contained setup in which a cooled SiPM array could substitute for a vacuum PMT. The SiPM's performance significantly improved when cooled by 43 degrees Celsius, as seen by qualitative and quantitative observations. Relatively compact and easy to use, this apparatus has the potential to advance low level light detection in many applications.

While very effective, liquid cooling requires a water flow and makes the device much less convenient to use. Air cooling can be used as a replacement, and a version of the device with an effective air cooling system is also contemplated. With a large heat sink and high powered fans, sufficient heat will be dissipated to cool the SiPM to the same temperatures that the liquid cooling can. An air-cooled device will require only electric power and a sealed controlled dry atmosphere.

Second Experimental Example

SiPM

The second experimental example used a Sensl ArrayB-30035-144P SiPM. This is a 50 by 50 mm mosaic of 144 pixels, each 3 millimeters on a side. Each pixel is an array of 35 by 35 μm avalanche photodiodes (APDs), giving an overall 72% active area fraction. These sensors detect light by summing the saturated outputs from all avalanche photodiodes (APDs) in a pixel. This model was selected to approximate a 2" PMT. Readout was accomplished using the tileable AB424T-ARRAY144P board from AiT Industries. This flexible board has a diode-coupled front-end to reduce noise, and offers single element, row-and-column, and position-encoded readout through the SiPMIM4 interface module, as well as bias voltage and SiPM temperature and current readouts.

Dark Count

At room temperature, Sensl specifies the dark current of the 3 mm pixels to be 2.8 μA at typical levels. With the specified gain of $3 \times 10^6$, this translates to a dark count of roughly 16 MHz per pixel, much too high to detect any low-level light signals. Single photon detection with SiPMs can be performed with small area devices and a tight time coincidence, either between devices on a single scintillator fiber or with an external time mark. However, for straightforward nuclear spectroscopy applications with large collecting area, the dark current represents a serious limitation. Since the dark current results from thermally activated carriers in the silicon, cooling the solid stated device should significantly reduce the problem. Typically, SiPM dark count decreases by an order of magnitude for each 30K decrease in temperature, until about 90K where the noise remains constant at approximately $1 \times 10^{-2}$ Hz/mm$^2$.

Results

An apparatus as shown in FIG. 4, FIG. 5A, and FIG. 5B was assembled and tested. The dark count measurements of the room temperature device and the cooled device are shown in Table 2 below.

TABLE 2

| Temperature (° C.) | 25 | −20 |
|---|---|---|
| Bias (V) | 32 | 32 |
| Threshold (mV) | Dark Count (kHz) | Dark Count (kHz) |
| 25 | 6630 | 190 |
| 50 | 4670 | 1 |
| 75 | 2410 | 0.08 |
| 100 | 1070 | 0.04 |
| 125 | 360 | 0.01 |

Table 2 shows data for the dark count of the SiPM as a function of temperature and threshold. As seen in Table 2, the dark count is decreased by factors ranging up to 100,000 at the highest thresholds. As seen in the next section, this results in a significant improvement in spectroscopic performance at −20° C. than without cooling.

Nuclear spectroscopy tests were performed with the array using a 2×2" NaI scintillator and gamma ray sources. The NaI was placed in contact with the viewing window of the SiPM apparatus without use of optical coupling grease. For comparison, a Photonis XP2230 PMT (2" diameter head-on boroscilicate glass) was alternately used to view the same NaI. The first source used was Cs-137, which has a single gamma ray peak at 662 keV. The Cs-137 Compton edge occurs around 450 keV, a Compton plateau from around 300 to 400 keV, and a backscatter peak at approximately 200 keV.

Figure 9A:
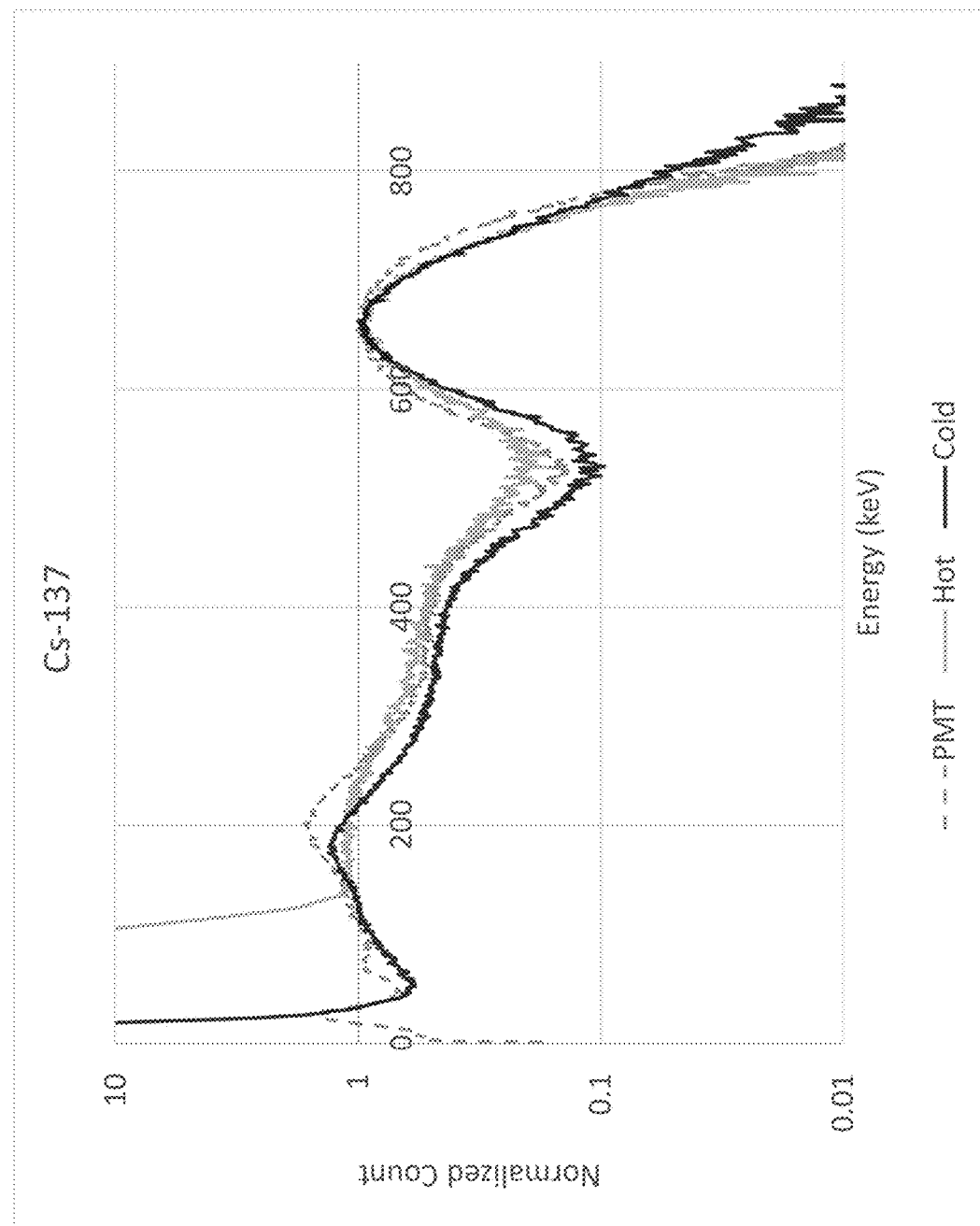
FIG. 9A is a graph showing experimental results.

In FIG. 9A, the normalized data for three measurements is shown: SiPM at room temperature, SiPM cooled, and room temperature PMT. All spectra resolve the photopeak, but the photopeak FWHM ratio was 20% at 25 degrees Celsius and 16% at −20 degrees Celsius. Another resolution measure is the valley to peak ratio between the Compton edge (525 keV) and the photopeak. These are 18% at 25 degrees and 9.6% at −19 degrees. The photopeak FWHM ratio was 20% at 25 degrees Celsius and 16% at −20 degrees Celsius. Qualitatively, one can also see the Compton edge, Compton plateau, and backscatter peak in the cold SiPM data while only the Compton edge is slightly visible in the room temperature SiPM data. The PMT has noise performance only below about 30 keV.

To see the low energy performance more clearly, the same tests were performed with a Ba-133 source, which emits gamma rays at 356, 303, 81, and 31 keV.

Figure 9B:
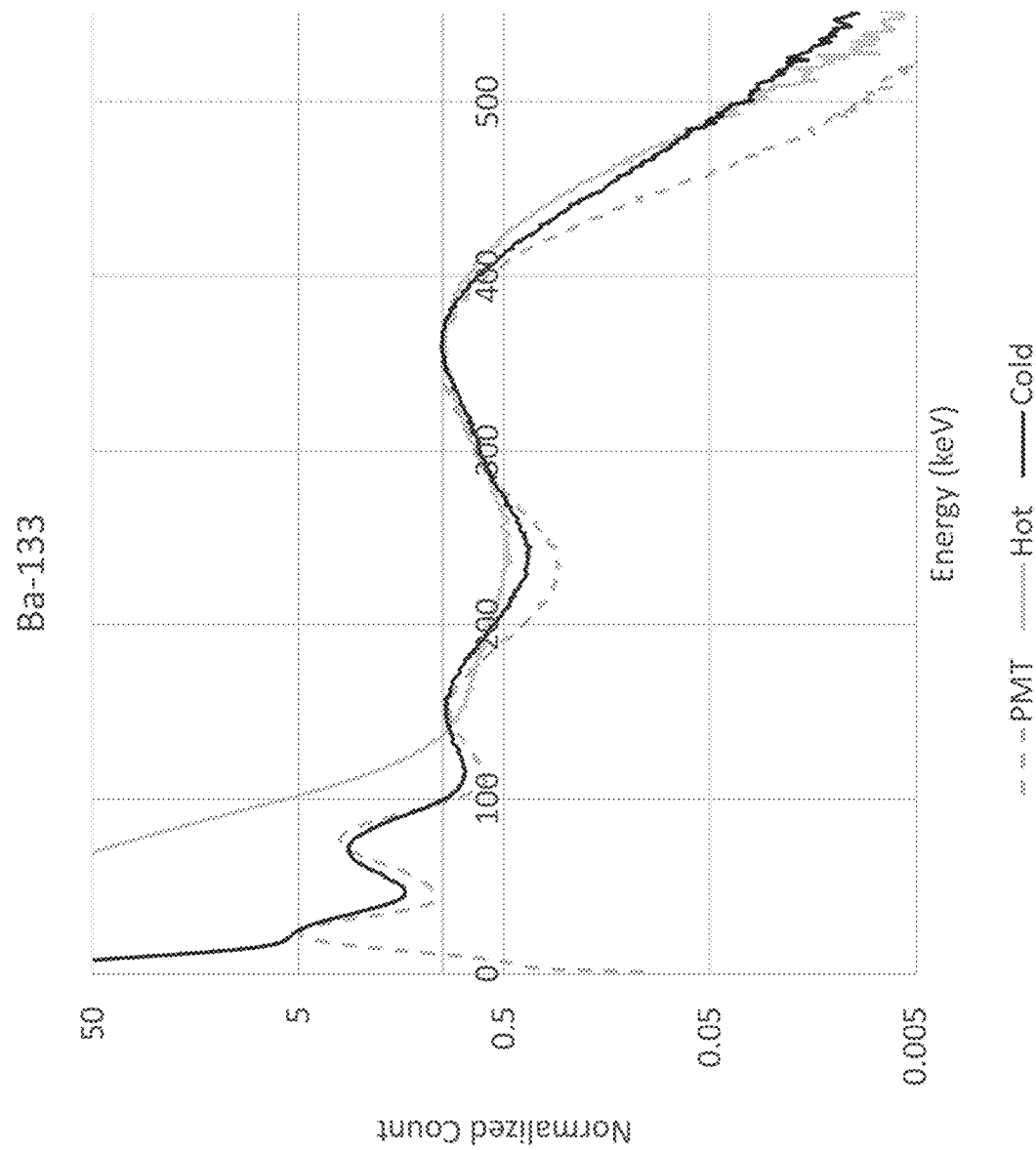
FIG. 9B is a graph showing experimental results.

FIG. 9B shows that the SiPM resolves only a broad maximum in the region of the 356 keV peak at room temperature. When cooled, the spectrum shows that this peak is made up of several gamma ray emissions; namely, the 356 and 303 keV begin to be resolved when cooled. In addition, the expected low energy peaks at 81, and even 31 keV (a shoulder) are visible only in the cooled SiPM (and PMT) spectra. Generally, the SiPM shows all the same peaks as the PMT measurements, with just slightly worse valley to peak ratios. With the present level of cooling, dark noise still obscures the spectrum below 30 keV.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. A light detection and measurement device, comprising:
    a silicon photomultiplier;
    at least one thermoelectric cooler thermally coupled to the silicon photomultiplier;
    a sealed enclosure surrounding the silicon photomultiplier and the at least one thermoelectric cooler, the enclosure including a substantially transparent window thermally coupled to the silicon photomultiplier; and
    a heat sinking device thermally coupled to the enclosure configured to remove waste heat;
    wherein the heat sinking device comprises a water-cooled heat sink.

2. The light detection and measurement device of claim 1, wherein the at least one thermoelectric cooler comprises two thermoelectric coolers arranged in series.

3. The light detection and measurement device of claim 1, wherein the at least one thermoelectric cooler comprises two thermoelectric coolers arranged in parallel.

4. The light detection and measurement device of claim 1, wherein the sealed enclosure comprises copper.

5. The light detection and measurement device of claim 1, wherein the sealed enclosure comprises stainless steel.

6. The light detection and measurement device of claim 1, wherein the window comprises sapphire.

7. The light detection and measurement device of claim 1, wherein the window is in direct contact with the silicon photomultiplier.

8. The light detection and measurement device of claim 1, wherein the window is thermally coupled to the silicon photomultiplier with a thermally conductive paste.

9. The light detection and measurement device of claim 1, wherein the heat sinking device comprises a forced-air cooled heat sink.

10. A light detection and measurement device, comprising:
    a silicon photomultiplier,
    at least one thermoelectric cooler thermally coupled to the silicon photomultiplier,
    a sealed enclosure surrounding the silicon photomultiplier and the at least one thermoelectric cooler, the enclosure including a substantially transparent window thermally coupled to the silicon photomultiplier, and
    a heat sinking device thermally coupled to the enclosure configured to remove waste heat;
    wherein the sealed enclosure is positioned in an outer enclosure,
    wherein the outer enclosure is filled with a dry gas.

11. The light detection and measurement device of claim 10, wherein the outer enclosure is fluidly connected to a vacuum pump configured to maintain a pressure in the outer enclosure of less than one milliTorr.

12. A method for cooling a silicon photomultiplier, comprising:
    providing a silicon photomultiplier and at least one thermoelectric cooler;
    cooling the silicon photomultiplier by energizing the thermoelectric cooler;
    removing waste heat from the thermoelectric cooler with a heat sinking device; and
    comprising enclosing the silicon photomultiplier and the at least one thermoelectric cooler in a sealed chamber filled with a dry gas.

13. The method of claim 12, wherein the at least one thermoelectric cooler comprises two thermoelectric coolers in series.

14. The method of claim 12, wherein the at least one thermoelectric cooler comprises two thermoelectric coolers in parallel.

15. The method of claim 12, further comprising enclosing the silicon photomultiplier and the at least one thermoelectric cooler in a vacuum chamber.

16. The method of claim 12, wherein the heat sinking device is a forced-air cooled heat sink.

17. A method for cooling a silicon photomultiplier, comprising:
    providing a silicon photomultiplier and at least one thermoelectric cooler;
    cooling the silicon photomultiplier by energizing the thermoelectric cooler;
    removing waste heat from the thermoelectric cooler with a heat sinking device; and
    cooling the silicon photomultiplier to a temperature less than −15° C.

* * * * *